(12) United States Patent
Yu

(10) Patent No.: US 6,251,757 B1
(45) Date of Patent: Jun. 26, 2001

(54) FORMATION OF HIGHLY ACTIVATED SHALLOW ABRUPT JUNCTION BY THERMAL BUDGET ENGINEERING

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/512,201

(22) Filed: Feb. 24, 2000

(51) Int. Cl.$^7$ .................................................. H01L 21/425
(52) U.S. Cl. ........................ 438/528; 438/231; 438/232; 438/305; 438/306; 438/514; 438/516; 438/664; 438/530; 438/532
(58) Field of Search .................................. 438/231, 232, 438/305, 306, 514, 528, 516, 664, 198, 308, 486, 488, 491, 511, 530, 532, 795

(56) References Cited

U.S. PATENT DOCUMENTS 5,266,510 * 11/1993 Lee ........................................ 438/298
6,037,204 * 3/2000 Chang et al. .......................... 438/231

* cited by examiner

Primary Examiner—Matthew Smith
Assistant Examiner—Craig P. Lytle

(74) Attorney, Agent, or Firm—Monica H. Choi

(57) ABSTRACT

In a method for fabricating a highly activated shallow abrupt doped junction in a semiconductor substrate, a first dopant is implanted into a predetermined surface of the semiconductor substrate to form a preamorphization junction having a first predetermined depth from the predetermined surface of the semiconductor substrate. Furthermore, a second dopant is implanted into the preamorphization junction with a dopant profile along a depth of the semiconductor substrate from the predetermined surface of the semiconductor substrate. A peak of the dopant profile is located at a fraction of the first predetermined depth of the preamorphization junction. A silicidation RTA (Rapid Thermal Anneal) is performed to form silicide on the semiconductor substrate. The silicidation RTA (Rapid Thermal Anneal) recrystallizes the preamorphization junction from the first predetermined depth of the preamorphization junction up to an unrecrystallized depth of the preamorphization junction. The unrecrystallized depth of the preamorphization junction does not reach up to the peak of the dopant profile. An additional RTA (Rapid Thermal Anneal) is performed to recrystallize the preamorphization junction from the unrecrystallized depth of the preamorphization junction substantially up to the predetermined surface of the semiconductor substrate. The highly activated shallow abrupt doped junction is formed by activation of a substantial portion of the second dopant in the preamorphization junction during the additional RTA (Rapid Thermal Anneal).

11 Claims, 2 Drawing Sheets

US 6,251,757 B1

FORMATION OF HIGHLY ACTIVATED SHALLOW ABRUPT JUNCTION BY THERMAL BUDGET ENGINEERING

TECHNICAL FIELD

The present invention relates generally to fabrication of field effect transistors having scaled-down dimensions, and more particularly, to a method for fabricating a highly activated shallow abrupt junction for the drain and the source extensions of a field effect transistor by thermal budget engineering.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which may be a polysilicon gate. A gate silicide 120 is formed on the polysilicon gate 118 for providing contact to the polysilicon gate 118. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the polysilicon gate 118 and the gate oxide 116. When the spacer 122 is comprised of silicon nitride (SiN), then a spacer liner oxide 124 is deposited as a buffer layer between the spacer 122 and the sidewalls of the polysilicon gate 118 and the gate oxide 116.

As dimensions of the MOSFET 100 are scaled further down to tens of nanometers, the drain extension 104 and the source extension 106 are desired to be abrupt and shallow junctions to minimize short-channel effects of the MOSFET 100, as known to one of ordinary skill in the art of integrated circuit fabrication. In addition, for enhancing the speed performance of the MOSFET 100 with scaled down dimensions, a high dopant concentration with high activation in the drain extension 104 and the source extension 106 is desired.

In the prior art, dopant within the drain extension 104 and the source extension 106 are activated using an activation RTA (Rapid Thermal Anneal) process. In addition, the silicides 110, 114, 120 are formed with an additional silicidation RTA (Rapid Thermal Anneal) process. The additional silicidation RTA process further heats up the semiconductor wafer 102, and such additional heating may deactivate the dopant within the drain extension 104 and the source extension 106 that have already been fully activated, as known to one of ordinary skill in the art of integrated circuit fabrication.

Such deactivation of the dopant within the drain extension 104 and the source extension 106 decreases the carrier mobility within the drain extension 104 and the source extension 106 and increases the series resistance at the drain and the source of the MOSFET 100. Such increase in series resistance at the drain and the source of the MOSFET 100 degrades the speed performance of the MOSFET 100.

However, the silicidation RTA (Rapid Thermal Anneal) process is desired for forming the silicides 110, 114, and 120 of the MOSFET 100. Thus, a method is desired for forming highly activated shallow abrupt junctions for the drain extension 110 and the source extension 114 of the MOSFET 100 despite the silicidation RTA (Rapid Thermal Anneal) process.

SUMMARY OF THE INVENTION

Accordingly, in a general aspect of the present invention, highly activated shallow abrupt junctions are formed in a semiconductor substrate given the performance of the silicidation RTA (Rapid Thermal Anneal), by thermal budget engineering.

In one embodiment of the present invention, in a method for fabricating a highly activated shallow abrupt doped junction in a semiconductor substrate, a first dopant is implanted into a predetermined surface of the semiconductor substrate to form a preamorphization junction having a first predetermined depth from the predetermined surface of the semiconductor substrate. Furthermore, a second dopant is implanted into the preamorphization junction with a dopant profile along a depth of the semiconductor substrate from the predetermined surface of the semiconductor substrate. A peak of the dopant profile is located at a fraction of the first predetermined depth of the preamorphization junction. A silicidation RTA (Rapid Thermal Anneal) is performed to form silicide on the semiconductor substrate. The silicidation RTA (Rapid Thermal Anneal) recrystallizes the preamorphization junction from the first predetermined depth of the preamorphization junction up to an unrecrystallized depth of the preamorphization junction. The unrecrystallized depth of the preamorphization junction does not reach up to the peak of the dopant profile.

An additional RTA (Rapid Thermal Anneal) is performed to recrystallize the preamorphization junction from the unrecrystallized depth of the preamorphization junction substantially up to the predetermined surface of the semiconductor substrate. The highly activated shallow abrupt doped junction is formed by activation of a substantial portion of the second dopant in the preamorphization junction during the additional RTA (Rapid Thermal Anneal).

In this manner, because the preamorphization junction is relatively deeper than the peak concentration of the second dopant, the silicidation RTA (Rapid Thermal Anneal) process recrystallizes only a portion of the preamorphization junction. Thus, the additional RTA (Rapid Thermal Anneal) process recrystallizes the portion of the preamorphization junction having a substantial portion of the second dopant such that deactivation of the second dopant is minimized. With such minimization of the deactivation of the second dopant, when the highly activated shallow abrupt doped junction is a drain or a source of a MOSFET (Metal Oxide Field Effect Transistor), the series resistance at the drain and the source of the MOSFET is minimized to enhance the speed performance of the MOSFET.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, and 5 refer to elements having similar structure and function.

DETAILED DESCRIPTION

Figure 2:
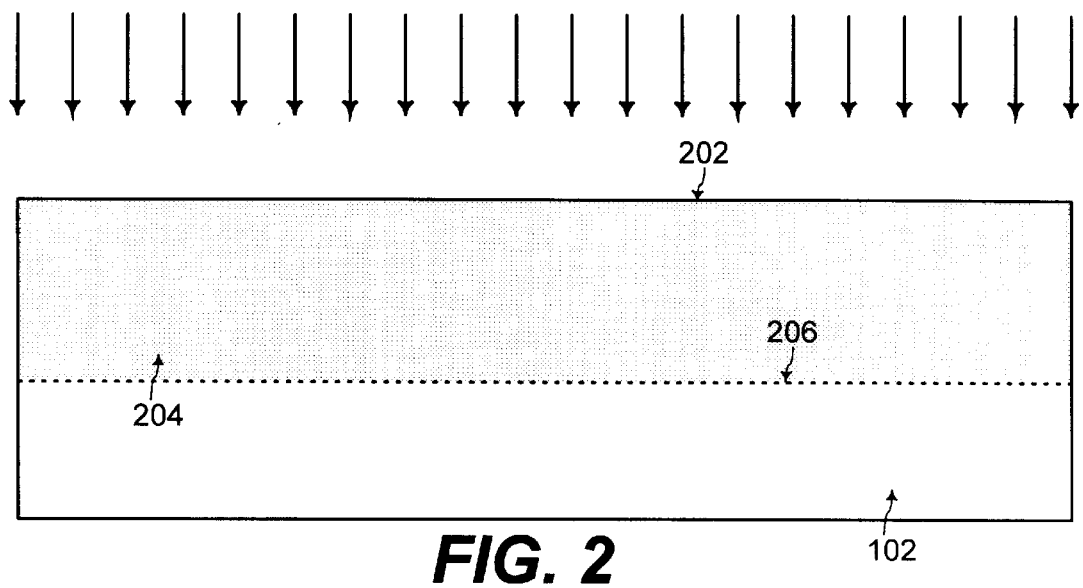
FIGS. 2, 3, 4, and 5 shows a cross-sectional view of a highly doped shallow abrupt junction formed according to an embodiment of the present invention by thermal budget engineering with formation of a relatively deep preamorphization junction.

Referring to FIG. 2, in a general aspect of the present invention, for forming a highly activated shallow abrupt doped junction, a first dopant is implanted into a predetermined surface 202 of the semiconductor substrate 102. The semiconductor substrate 102 is comprised of a semiconductor material such as silicon for example. With the implantation of the first dopant, a preamorphization junction 204 is formed to have a first predetermined depth 206 from the predetermined surface 202 of the semiconductor substrate 102.

The first dopant implanted for forming the preamorphization junction 204 may be silicon ions or germanium ions for example. The preamorphization junction 204 is a relatively deep junction with the first predetermined depth 206 being in a range of from about 800 Å (angstroms) to about 1500 Å (angstroms).

Figure 3:
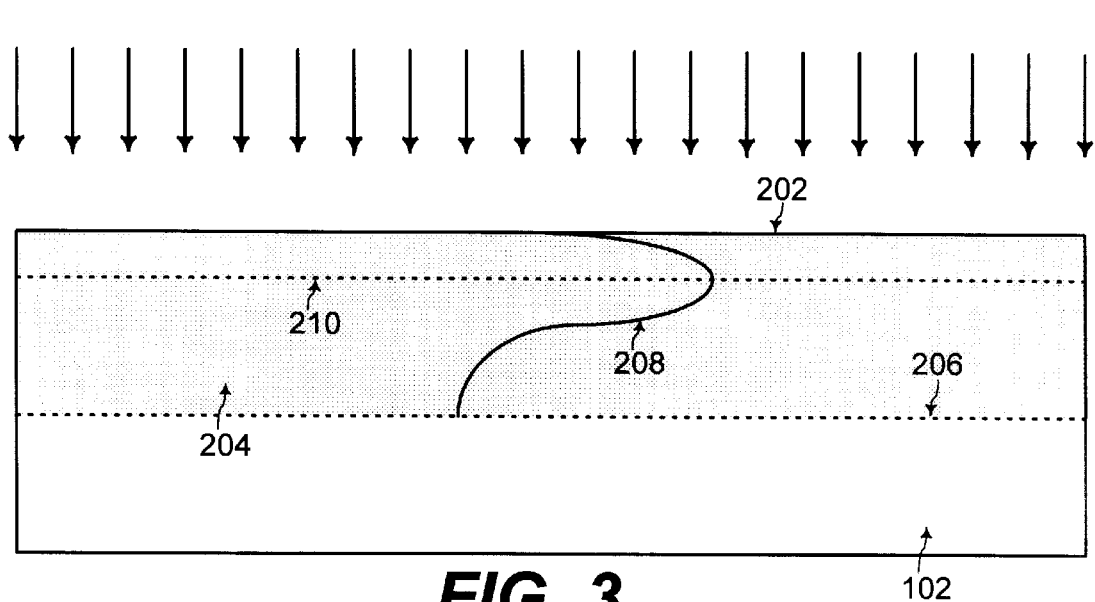

Referring to FIG. 3, a second dopant is implanted into the preamorphization junction 204 with a dopant profile 208 along a depth of the semiconductor substrate 102 from the predetermined surface 202 of the semiconductor substrate 102. A peak of the dopant profile 208 is located at a second predetermined depth 210 from the predetermined surface 202 of the semiconductor substrate 102. The second predetermined depth 210 of the peak of the dopant profile 208 is located at a fraction of the first predetermined depth 206 of the preamorphization junction 206. For example, when the first predetermined depth 206 is in a range of from about 800 Å (angstroms) to about 1500 Å (angstroms), the second predetermined depth 210 of the peak of the dopant profile 208 is in a range of from about 50 Å (angstroms) to about 150 Å (angstroms).

When the highly activated shallow abrupt doped junction to be formed is used as a drain extension 104 or a source extension 106 of a MOSFET (Metal Oxide Semiconductor Field Effect Transistor), the second dopant is an N-type dopant for forming the drain extension 104 or the source extension 106 of an NMOSFET (N-channel Metal Oxide Semiconductor Field Effect Transistor). Alternatively, the second dopant is a P-type dopant for forming the drain extension 104 or the source extension 106 of a PMOSFET (P-channel Metal Oxide Semiconductor Field Effect Transistor).

The second dopant implanted within the preamorphization junction 204 is activated for maximizing the conductivity in the preamorphization junction 204. The formation of the preamorphization junction 204 before the implantation of the second dopant lowers the temperature for activation of the second dopant within the preamorphization junction 204. A lower temperature for activation is desired for forming a shallow abrupt doped junction since a lower temperature minimizes thermal diffusion of dopants.

Figure 1:
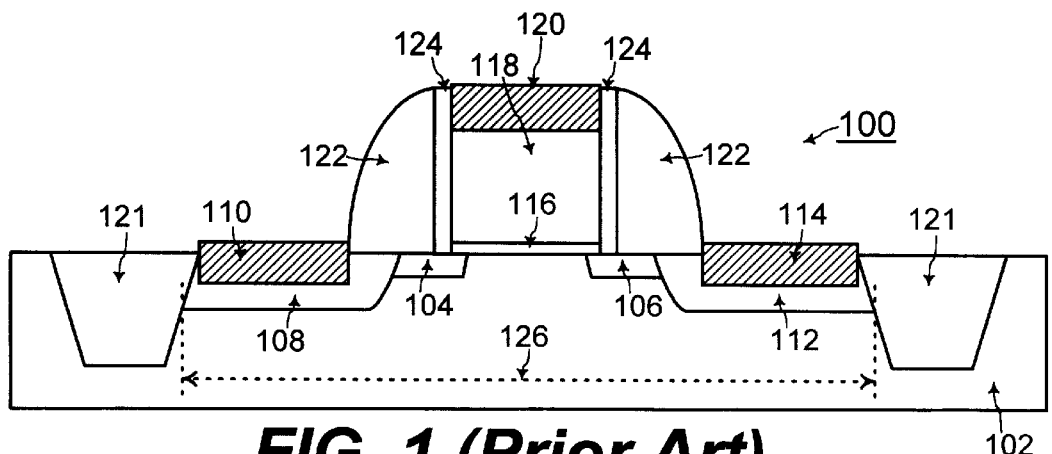
FIG. 1 shows a cross-sectional view of a MOSFET (Metal Oxide Semiconductor Field Effect Transistor) having drain and source contact junctions and drain and source extension implants.

Referring to FIG. 1, when the highly activated shallow abrupt doped junction to be formed is used as a drain extension 104 or a source extension 106 of the MOSFET 100, a silicidation RTA (Rapid Thermal Anneal) process is performed to form the silicides 110, 114, and 120 of the MOSFET 100. During such a silicidation RTA, the semiconductor wafer 102 is heated. For example when the suicides 110, 114, and 120 are comprised of nickel silicide (NiSi), the semiconductor wafer 102 is heated to 500° Celsius for approximately 30 seconds, as known to one of ordinary skill in the art of integrated circuit fabrication.

Figure 4:
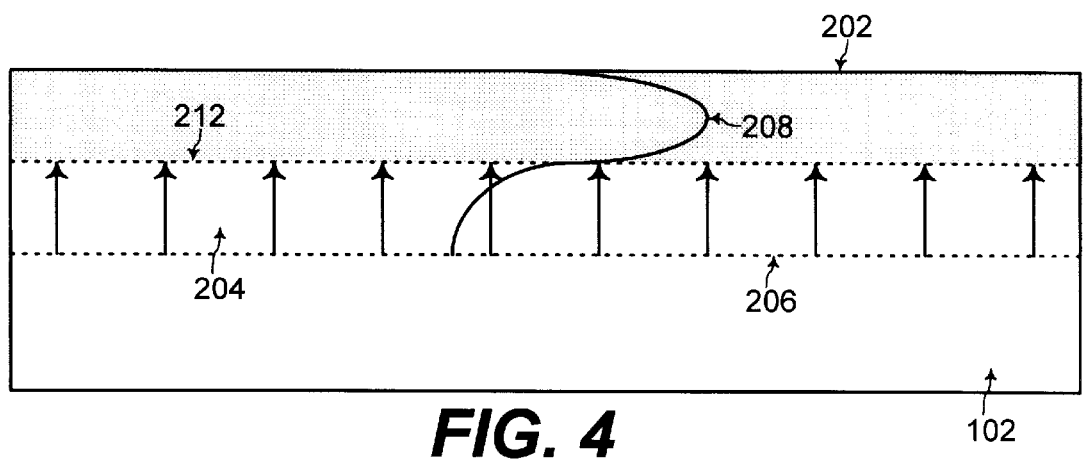

Referring to FIG. 4, during such a silicidation RTA, a portion of the preamorphization junction 204 is recrystallized from the predetermined depth 206 of the preamorphization junction 204 up to an unrecrystallized depth 212 of the preamorphization junction 204. The first predetermined depth 206 of the preamorphization junction 204 is designed to be relatively deep (i.e. in a range of from about 800 Å (angstroms) to about 1500 Å (angstroms)) such that the unrecrystallized depth 212 of the preamorphization junction 204 does not reach up to the peak 210 of the dopant profile 208 during the silicidation RTA. For example, when the first predetermined depth 206 of the preamorphization junction 204 is in a range of from about 800 Å (angstroms) to about 1500 Å (angstroms), the unrecrystallized depth 212 is in a range of from about 250 Å (angstroms) to about 300 Å (angstroms) from the predetermined surface 202 of the semiconductor wafer 102.

Figure 5:
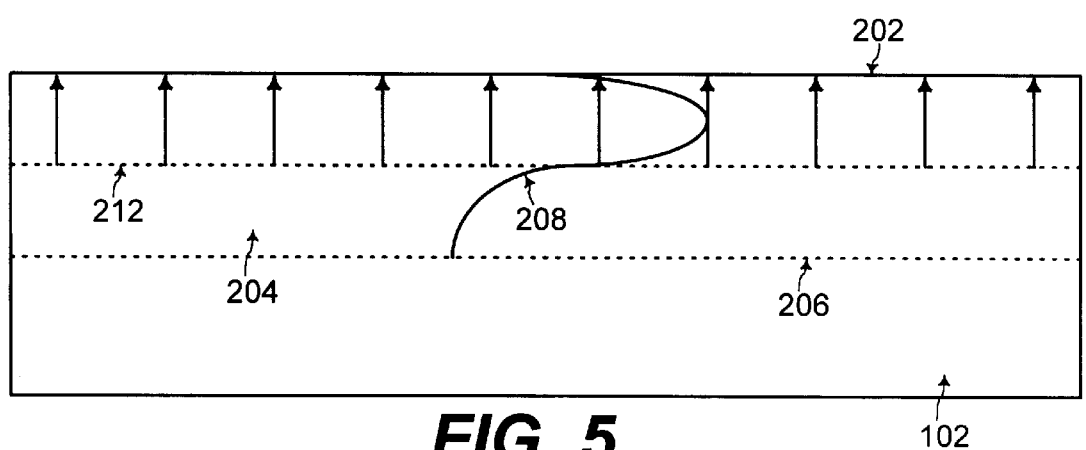

Referring to FIG. 5, for activating the substantial portion of the second dopant, an additional RTA (Rapid Thermal Anneal) is performed to recrystallize the preamorphization junction 204 from the unrecrystallized depth 212 of the preamorphization junction 204 substantially up to the predetermined surface 202 of the semiconductor substrate 102. The highly activated shallow abrupt doped junction is formed by activation of a substantial portion of the second dopant in the preamorphization junction 204 during the additional RTA. The additional RTA is performed at a relatively low temperature in a range of from about 500° Celsius to about 600° Celsius.

The additional RTA is stopped when the preamorphization junction 204 is recrystallized from the unrecrystallized depth 212 of the preamorphization junction 204 substantially up to the predetermined surface 202 of the semiconductor substrate 102. Any further heating of the semiconductor substrate 102 would undesirably deactivate the second dopant within the preamorphization junction 204.

In this manner, by forming a relatively deep preamorphization junction 204, only a portion of the preamorphization junction 204 is recrystallized during a silicidation RTA used for forming silicide. The additional RTA for recrystallizing the remaining portion of the preamorphization junction 204 is controlled to minimize deactivation of the second dopant within the preamorphization junction 204. In this manner, a highly activated shallow abrupt junction is formed from activation of the second dopant having the dopant profile 208.

The present invention may be used to particular advantage when such a highly activated shallow abrupt junction is formed as a drain extension or a source extension of a MOSFET (Metal Oxide Semiconductor Field Effect Transistor). With minimization of deactivation of the second dopant within the preamorphization junction 204, the series resistance at the drain and the source of the MOSFET is minimized such that the speed performance of the MOSFET is enhanced.

The foregoing is by way of example only and is not intended to be limiting. For example, any specified thickness or any specified material of any structure described herein is by way of example only. Furthermore, as will be understood by those skilled in the art, the structures described herein may be made or used in the same way regardless of their position and orientation. Accordingly, it is to be understood that terms and phrases such as "depth" and "sidewall" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a doped junction in a semiconductor substrate, the method including the steps of:
   A. implanting a first dopant into a predetermined surface of said semiconductor substrate to form a preamorphization junction having a predetermined depth from said predetermined surface of said semiconductor substrate;
   B. implanting a second dopant into said preamorphization junction with a dopant profile along a depth of said semiconductor substrate from said predetermined surface of said semiconductor substrate, wherein a peak of said dopant profile is located at a fraction of said predetermined depth of said preamorphization junction;
   C. performing a silicidation RTA (Rapid Thermal Anneal) to form silicide on said semiconductor substrate, wherein said silicidation RTA (Rapid Thermal Anneal) recrystallizes said preamorphization junction from said predetermined depth of said preamorphization junction up to an unrecrystallized depth of said preamorphization junction, and wherein said unrecrystallized depth of said preamorphization junction does not reach up to said peak of said dopant profile; and
   D. performing an additional RTA (Rapid Thermal Anneal) to recrystallize said preamorphization junction from said unrecrystallized depth of said preamorphization junction substantially up to said predetermined surface of said semiconductor substrate, wherein said doped junction is formed by activation of a substantial portion of said second dopant in said preamorphization junction during said additional RTA (Rapid Thermal Anneal).

2. The method of claim 1, wherein said first dopant is one of silicon ions or germanium ions.

3. The method of claim 1, wherein said predetermined depth of said preamorphization junction is in a range of from about 800 Å (angstroms) to about 1500 Å (angstroms).

4. The method of claim 3, wherein said silicidation RTA (Rapid Thermal Anneal) is performed at a temperature of about 500° Celsius for a time duration of about 30 seconds.

5. The method of claim 4, wherein said unrecrystallized depth of said preamorphization junction is in a range of from about 250 Å (angstroms) to about 300 Å (angstroms) from said predetermined surface of said semiconductor wafer.

6. The method of claim 5, wherein said peak concentration of said dopant profile of said second dopant is in a range of from about 50 Å (angstroms) to about 150 Å (angstroms) from said predetermined surface of said semiconductor wafer.

7. The method of claim 1, wherein said doped junction forms one of a source extension or a drain extension of a MOSFET (Metal Oxide Semiconductor Field Effect Transistor).

8. The method of claim 7, wherein said second dopant is a P-type dopant for a PMOSFET (P-channel Metal Oxide Semiconductor Field Effect Transistor).

9. The method of claim 7, wherein said second dopant is an N-type dopant for an NMOSFET (N-channel Metal Oxide Semiconductor Field Effect Transistor).

10. The method of claim 1, wherein said additional RTA (Rapid Thermal Anneal) is performed at a temperature in a range of from about 500° Celsius to about 600° Celsius.

11. A method for fabricating a doped junction in a semiconductor substrate, the method including the steps of:
    A. implanting a first dopant into a predetermined surface of said semiconductor substrate to form a preamorphization junction having a predetermined depth from said predetermined surface of said semiconductor substrate,
       wherein said first dopant is one of silicon ions or germanium ions,
       and wherein said predetermined depth of said preamorphization junction is in a range of from about 800 Å (angstroms) to about 1500 Å (angstroms);
    B. implanting a second dopant into said preamorphization junction with a dopant profile along a depth of said semiconductor substrate from said predetermined surface of said semiconductor substrate,
       wherein a peak of said dopant profile is located at a fraction of said predetermined depth of said preamorphization junction,
       and wherein said peak concentration of said dopant profile of said second dopant is in a range of from about 50 Å (angstroms) to about 150 Å (angstroms) from said predetermined surface of said semiconductor wafer;
    C. performing a silicidation RTA (Rapid Thermal Anneal) to form silicide on said semiconductor substrate, wherein said silicidation RTA (Rapid Thermal Anneal) recrystallizes said preamorphization junction from said predetermined depth of said preamorphization junction up to an unrecrystallized depth of said preamorphization junction, and wherein said unrecrystallized depth of said preamorphization junction does not reach up to said peak of said dopant profile,
       and wherein said silicidation RTA (Rapid Thermal Anneal) is performed at a temperature of about 500° Celsius for a time duration of about 30 seconds,
       and wherein said unrecrystallized depth of said preamorphization junction is in a range of from about 250 Å (angstroms) to about 300 Å (angstroms)

from said predetermined surface of said semiconductor wafer; and

D. performing an additional RTA (Rapid Thermal Anneal) to recrystallize said preamorphization junction from said unrecrystallized depth of said preamorphization junction substantially up to said predetermined surface of said semiconductor substrate, wherein said doped junction is formed by activation of said second dopant in said preamorphization junction, and wherein said additional RTA (Rapid Thermal Anneal) is performed at a temperature in a range of about 500° Celsius to about 600° Celsius, and wherein said doped junction forms one of a source extension or a drain extension of a MOSFET (Metal Oxide Semiconductor Field Effect Transistor), and wherein said second dopant is a P-type dopant for a PMOSFET (P-channel Metal Oxide Semiconductor Field Effect Transistor), and wherein said second dopant is an N-type dopant for an NMOSFET (N-channel Metal Oxide Semiconductor Field Effect Transistor).

* * * * *